US 9,103,000 B2

United States Patent
Munteanu et al.

(10) Patent No.: US 9,103,000 B2
(45) Date of Patent: Aug. 11, 2015

(54) LOW MELTING POINT SPUTTER TARGETS FOR CHALCOGENIDE PHOTOVOLTAIC APPLICATIONS AND METHODS OF MANUFACTURING THE SAME

(75) Inventors: Mariana Munteanu, Santa Clara, CA (US); Brian Josef Bartholomeusz, Palo Alto, CA (US); Michael Bartholomeusz, Phoenix, AZ (US); Erol Girt, Burnaby (CA)

(73) Assignee: ZETTA RESEARCH AND DEVELOPMENT LLC—AQT SERIES, Wilmington, DE (US)

( * ) Notice: Subject to any disclaimer, the term of this patent is extended or adjusted under 35 U.S.C. 154(b) by 682 days.

(21) Appl. No.: 12/953,129

(22) Filed: Nov. 23, 2010

(65) Prior Publication Data
US 2011/0290643 A1 Dec. 1, 2011

Related U.S. Application Data

(60) Provisional application No. 61/264,568, filed on Nov. 25, 2009.

(51) Int. Cl.
*C22C 9/00* (2006.01)
*C23C 14/06* (2006.01)
(Continued)

(52) U.S. Cl.
CPC ............ *C22C 1/0491* (2013.01); *C04B 35/547* (2013.01); *C04B 35/6455* (2013.01); *C04B 35/653* (2013.01); *C23C 14/0623* (2013.01); *C23C 14/3414* (2013.01); *B22F 2998/10* (2013.01); *C04B 2235/3201* (2013.01); *C04B 2235/3206* (2013.01); *C04B 2235/3217* (2013.01); *C04B 2235/3232* (2013.01); *C04B 2235/3239* (2013.01);
(Continued)

(58) Field of Classification Search
USPC .................. 75/228–250, 950; 148/432–436; 420/469–500; 257/E31.027, E31.029; 204/298.12, 298.13; 438/85, 95; 427/255.29, 255.31
See application file for complete search history.

(56) References Cited

U.S. PATENT DOCUMENTS

2007/0093059 A1* 4/2007 Basol ............................ 438/687
2007/0099332 A1* 5/2007 Kardokus et al. ............... 438/95
(Continued)

FOREIGN PATENT DOCUMENTS

JP 2002-064108 A 2/2002

OTHER PUBLICATIONS

R. A. Wibowo, W. S. Kim, B. Munir, K. H. Kim, "Growth and Properties of Stannite-Quaternary Cu2ZnSnSe4 Thin Films Prepared by Selenization of Sputtered Binary Compound Precursors," Advanced Materials Research, vols. 29-30 (2007), pp. 79-82, available online since Nov. 15, 2007.*

*Primary Examiner* — Scott Kastler
*Assistant Examiner* — Vanessa Luk
(74) *Attorney, Agent, or Firm* — Mattingly & Malur, PC

(57) ABSTRACT

In one example embodiment, a sputter target structure for depositing semiconducting chalcogenide films is described. The sputter target includes a target body having a target body composition that comprises $Cu_{1-x}(Se_{1-y-z}S_yTe_z)_x$, wherein the value of x is greater than or equal to approximately 0.5, the value of y is between approximately 0 and approximately 1, the value of z is between approximately 0 and approximately 1, and the total amount of Se, S, and Te phases in the target body composition comprise less than 50 volume percent of the target body composition.

12 Claims, 7 Drawing Sheets

(51) Int. Cl.
- *C23C 14/34* (2006.01)
- *C22C 1/04* (2006.01)
- *C04B 35/547* (2006.01)
- *C04B 35/645* (2006.01)
- *C04B 35/653* (2006.01)

(52) U.S. Cl.
CPC ............... *C04B 2235/3244* (2013.01); *C04B 2235/3251* (2013.01); *C04B 2235/3256* (2013.01); *C04B 2235/3258* (2013.01); *C04B 2235/3262* (2013.01); *C04B 2235/3281* (2013.01); *C04B 2235/3284* (2013.01); *C04B 2235/3286* (2013.01); *C04B 2235/3289* (2013.01); *C04B 2235/3293* (2013.01); *C04B 2235/3296* (2013.01); *C04B 2235/3298* (2013.01); *C04B 2235/3418* (2013.01); *C04B 2235/42* (2013.01); *C04B 2235/6565* (2013.01); *C04B 2235/72* (2013.01); *C04B 2235/721* (2013.01); *C04B 2235/722* (2013.01); *C04B 2235/723* (2013.01); *C04B 2235/77* (2013.01)

(56) References Cited

U.S. PATENT DOCUMENTS

| | | | |
|---|---|---|---|
| 2007/0163643 A1* | 7/2007 | Van Duren et al. | 136/262 |
| 2007/0163644 A1 | 7/2007 | Van Duren et al. | |
| 2008/0092945 A1* | 4/2008 | Munteanu et al. | 136/252 |
| 2008/0271779 A1* | 11/2008 | Miller et al. | 136/252 |
| 2010/0108503 A1* | 5/2010 | Bartholomeusz et al. | 204/298.13 |

\* cited by examiner

LOW MELTING POINT SPUTTER TARGETS FOR CHALCOGENIDE PHOTOVOLTAIC APPLICATIONS AND METHODS OF MANUFACTURING THE SAME

CROSS-REFERENCE TO RELATED APPLICATIONS

The present application claims priority to U.S. Provisional Application Ser. No. 61/264,568 filed Nov. 25, 2009, which is incorporated by reference herein for all purposes.

TECHNICAL FIELD

The present disclosure generally relates to manufacturing photovoltaic devices, and particularly, to the manufacture of low melting point sputter targets for depositing semiconducting chalcogenide films for such devices.

BACKGROUND

Semiconducting chalcogenide films are typically used as absorber layers in photovoltaic devices, such as solar cells. A chalcogenide is a chemical compound consisting of at least one chalcogen ion (group 16 (VI) elements in the periodic table, e.g., sulfur (S), selenium (Se), and tellurium (Te)) and at least one more electropositive element. As those of skill in the art will appreciate, references to chalcogenides are generally made in reference to sulfides, selenides, and tellurides only. Thin film based solar cell devices may utilize these chalcogenide semiconductor materials as the absorber layer(s) as is or, alternately, in the form of an alloy with other elements or even compounds like oxides, nitrides and carbides, among others. Chalcogenide (both single and mixed) semiconductors have optical band gaps well within the terrestrial solar spectrum, and hence, can be used as photon absorbers in thin film based solar cells to generate electron hole pairs and convert light energy to usable electrical energy.

Physical vapor deposition (PVD) based processes, and particularly sputter based deposition processes, have conventionally been utilized for high volume manufacturing of such thin film layers with high throughput and yield. These thin film layers can be deposited by the sputtering (in the form of reactive/non-reactive or co-sputtering) of high purity sputter targets. Generally, the quality of the resultant semiconductor thin films depends on the quality of the sputter target supplying the material which, similarly, generally depends on the quality of the target's fabrication. Providing manufacturing simplicity while ensuring exact stoichiometry control can ideally be achieved by non-reactive sputter of high purity sputter targets of the appropriate materials having the same stoichiometry. However, as some of these materials have different atomic specie with varying sputter rates, as well as different melting points, achieving the exact desired stoichiometry in the thin film presents a challenge. Any non-stoichiometry in the resultant thin film can contribute to non-adjusted charge compensations in the structure and can affect the device characteristics. Additionally, the incorporation of impurities from the sputter targets into the thin film absorber layers can also cause inconsistent and unreliable device characteristics. By way of example, impurities can act as trap levels (which would vary based on different impurities and their relative concentrations) in the band gap. Furthermore, the sputter targets themselves should have adequate density in order to minimize arcing and defect generation during the deposition process, as these can limit the process yield.

DESCRIPTION OF EXAMPLE EMBODIMENTS

Figure 1:
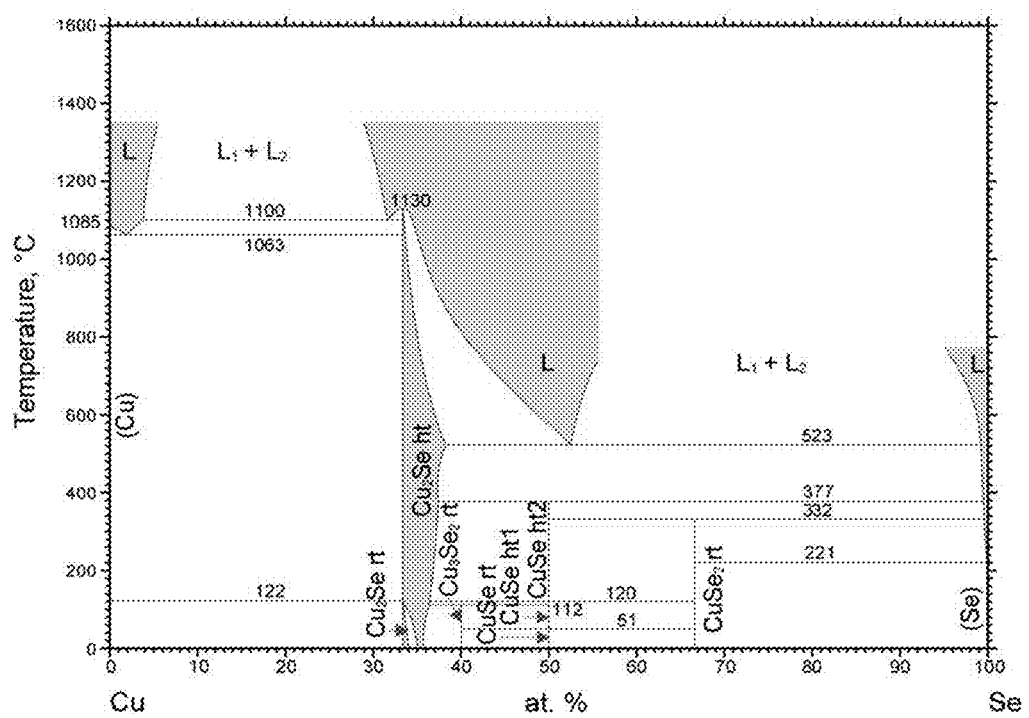
FIG. 1 shows an equilibrium Cu—Se phase diagram.

The present disclosure generally relates to sputter targets suitable for use in photovoltaic applications, and particularly, to the manufacture of low melting point sputter targets for depositing semiconducting chalcogenide films for such applications.

Copper indium gallium diselenide (e.g., $Cu(In_{1-x}Ga_x)Se_2$, where x is less than or equal to approximately 0.7), copper indium gallium selenide sulfide (e.g., $Cu(In_{1-x}Ga_x)(Se_{1-y}S_y)_2$, where x is less than or equal to approximately 0.7 and y is less than or equal to approximately 0.99), and copper indium gallium disulfide (e.g., $Cu(In_{1-x}Ga_x)S_2$, where x is less than or equal to approximately 0.7), each of which is commonly referred to as a "CIGS" material, have been successfully used in the fabrication of thin film absorbers in photovoltaic cells largely due to their relatively large absorption coefficients. In fact, photovoltaic cells having photovoltaic efficiencies greater or equal than approximately 20% have been manufactured using copper indium gallium diselenide absorber layers. Efforts to minimize the defect density in the absorber layer(s) (hereinafter referred to as "absorber layer" or "absorber") have enabled the manufacture of high quality CIGS thin film photovoltaic cells. By way of example, reducing the defect density in the absorber layer may be achieved by heating the CIGS material close to its melting temperature, which facilitates grain growth and defect removal in the absorber layer. However, unfortunately, the melting temperature of CIGS materials is relatively large (e.g., close to 1000 degrees Celsius) and, thus, this approach is generally not economical from a fabrication stand point. Furthermore, in order to use glass substrates the fabrication process can generally not significantly exceed process temperatures of approximately 500 degrees Celsius. In particular embodiments, to overcome these and other challenges, a sputter target is manufactured for use in depositing a CIGS absorber layer that comprises at least one material having a relatively low melting temperature. By way of example, In has a melting temperature of approximately 157 degrees Celsius, Se has a melting temperature of approximately 217 degrees Celsius, S has a melting temperature of approximately 113 degrees Celsius, Ga has a melting temperature of approximately 30 degrees Celsius, and $Cu_{1-x}Se_x$ (e.g., where x is greater than or equal to approximately 0.53) has a melting temperature of approximately 523 degrees Celsius.

It has been determined that, in order to manufacture photovoltaic cells having efficiencies at or exceeding 12%, Se and/or S have to be present in the CIGS absorber. Unfortunately, controlling Se and S compositions in CIGS materials has conventionally not been easy to achieve. Se and S have low vapor pressures and, thus, can escape from Cu and In layers during annealing or deposition at high process temperatures. In CuSe and CuS layers, this generally results in an increase in the Cu/Se or Cu/S ratios, respectively, as well as an increase in the melting point of these layers. By way of example, as shown in the equilibrium Cu—Se phase diagram of FIG. 1, the $Cu_2Se$ material has a melting point over twice that of $Cu_{1-x}Se_x$ (where x is greater than or equal to approximately 0.53). Similarly, as shown in the equilibrium Cu—S phase diagram of FIG. 2, the $Cu_{1.8}S$ material also has a much higher melting temperature than $Cu_{1-x}S_x$ (where x is greater than or equal to approximately 0.5). Additionally, FIG. 3 shows an equilibrium Cu—Te phase diagram. Loss of Se and S in CIGS layers can result in the presence of Se and S vacancies in the resultant absorber layers than can diminish the electrical performance of these CIGS absorbers. Additionally, the loss of Se and S can induce the formation of phases with different stoichiometry than that of copper indium gallium diselenide and copper indium gallium disulfide. These induced phases often have detrimental effects on the electrical performance of CIGS absorber layers.

One method of controlling Se or S compositions is to sputter or anneal Cu and In layers in the presence of $H_2S$ and/or $H_2Se$. Both $H_2S$ and $H_2Se$ are toxic and flammable, and thus, must be handled with care. However, such a method does allow for precise dosing and very tight control of the chalcogenide constituent. Another method involves sputtering or annealing Cu and In layers in an atmosphere of Se or S vapors. However, thermal evaporation of Se and S is conventionally not easy to control in high throughput fabrication processes. The sulfurization/selenization occurs in an environment of excess chalcogenide and cannot be precisely dosed or controlled. Furthermore, to minimize Se or S loss, the Cu and In layers can be rapidly annealed. By way of example, in a rapid annealing process, the temperature of the substrate upon which the photovoltaic cells are deposited/grown may be increased one or more degrees Celsius per second (or significantly faster) to minimize Se or S evaporation.

Another method to avoid Se or S loss is to increase the deposition rate of Se or S containing materials sputtered at elevated temperatures. By way of example, the sputtering process may utilize magnetron sputtering. Magnetron sputtering is an established technique used for deposition of metallic layers in magnetic hard drives and microelectronics as well as the deposition of intrinsic and conductive oxide layers in semiconductor applications. Advantages of using magnetron sputtering may include high deposition rates and accurate control of the thickness and composition of the deposited film over a large area. However, magnetron sputtering may not be suitable for sputtering Se or S-only layers. Thus, in some embodiments, Se and S may be deposited using techniques such as thermal evaporation.

Particular embodiments of the present disclosure relate to the fabrication of low melting point sputter targets, and particularly, low melting point sputter targets formed of Cu—Se, Cu—S, Cu—Te, or suitable combinations thereof (hereinafter referred to collectively as Cu—(Se,S,Te)). In one particular application, such sputter targets are used in sputtering multilayer thin film structures (e.g., for a CIGS-based absorber layer in a photovoltaic device) that include one or more layers of (In,Ga)(Se,S) and $Cu_{1-x}(Se_{1-y}S_y)_x$ (e.g., where x is greater than or equal to approximately 0.5 and where y may range from 1 to 1), two or more of which may be sputtered in an alternating fashion (and hereinafter written as $(In,Ga)(Se,S)/Cu_{1-x}(Se_{1-y}S_y)_x$). The multilayer structure may then be annealed after deposition of all of the absorber layers, or periodically or intermittently through the sputtering process (e.g., after two or more alternating layers are deposited).

In a second particular application, a sputter target is used in sputtering a thin film of (In,Ga)(Se,S) at temperatures below approximately 450 degrees Celsius followed by using a sputter target to sputter a thin film of $Cu_{1-x}Se_x$ (e.g., where x is greater than or equal to approximately 0.5) at temperatures above approximately 450 degrees Celsius.

As evidenced by, for example, the equilibrium phase diagram shown in FIG. 1, fabricating such low melting point sputter targets presents a number of challenges. By way of example, as shown in FIG. 1, below approximately 332 degrees Celsius CuSe (CuSe ht2 in the diagram) and $CuSe_2$ ($CuSe_2$ rt in the diagram) or $Cu_2Se$ ($Cu_2Se$ ht in the diagram) and Se phases are present in alloys of $Cu_{1-x}Se_x$ (e.g., where x is greater than or equal to approximately 0.5) depending more specifically on the material composition. As is also evidenced by the phase diagram shown in FIG. 1, above approximately 332 degrees Celsius, the $CeSe_2$ phase is not significantly any more stable and alloys of $Cu_{1-x}Se_x$ (e.g., where x is greater than or equal to approximately 0.5) consist of CuSe and Se phases where Se is in liquid form. Also of note, a few percent of Cu is dissolved in Se above 332 degrees Celsius. At still further increased temperatures, such as above approximately 377 degrees Celsius, CuSe is still not significantly any more stable while $Cu_{1-x}Se_x$ (e.g., where x is greater than or equal to approximately 0.5) alloys consist of the $Cu_2Se$ phase, which has a melting point over 1000 degrees Celsius, and the Se liquid phase (a few percent of Cu is dissolved in Se above 377 degrees Celsius). As already described above, Se has a low vapor pressure and can escape from Se containing materials at elevated temperatures. Furthermore, it is expected that the evaporation of Se will further increase if liquid Se is present in the material. Thus, in particular embodiments, in a $Cu_{1-x}Se_x$ (e.g., where x is greater than or equal to approximately 0.5) alloy sputter target, the amount of $Cu_2Se$ (high melting phase) and Se phases should be minimized while the amount of CuSe and $CuSe_2$ phases should be maximized. Furthermore, it should also be noted that fabrication of $Cu_{1-x}Se_x$ (e.g., where x is greater than or equal to approximately 0.5) alloy sputter targets is not trivial and may be accompanied by adding extra Se to compensate for Se loss when sputtering thin films (e.g., for CIGS absorbers for photovoltaic devices).

Figure 2:
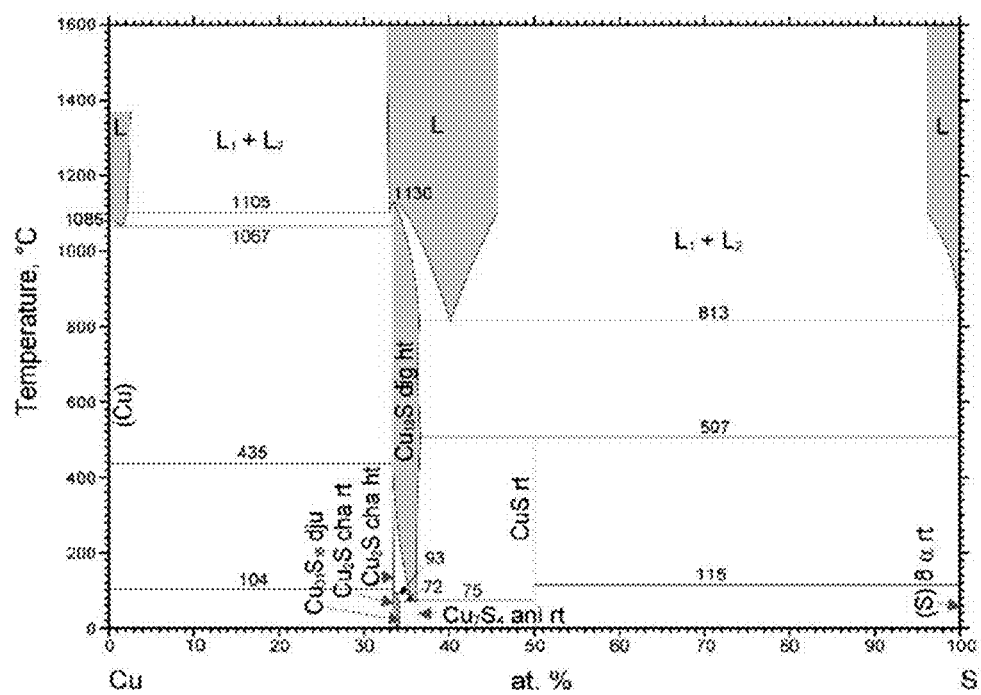
FIG. 2 shows an equilibrium Cu—S phase diagram.
Figure 3:
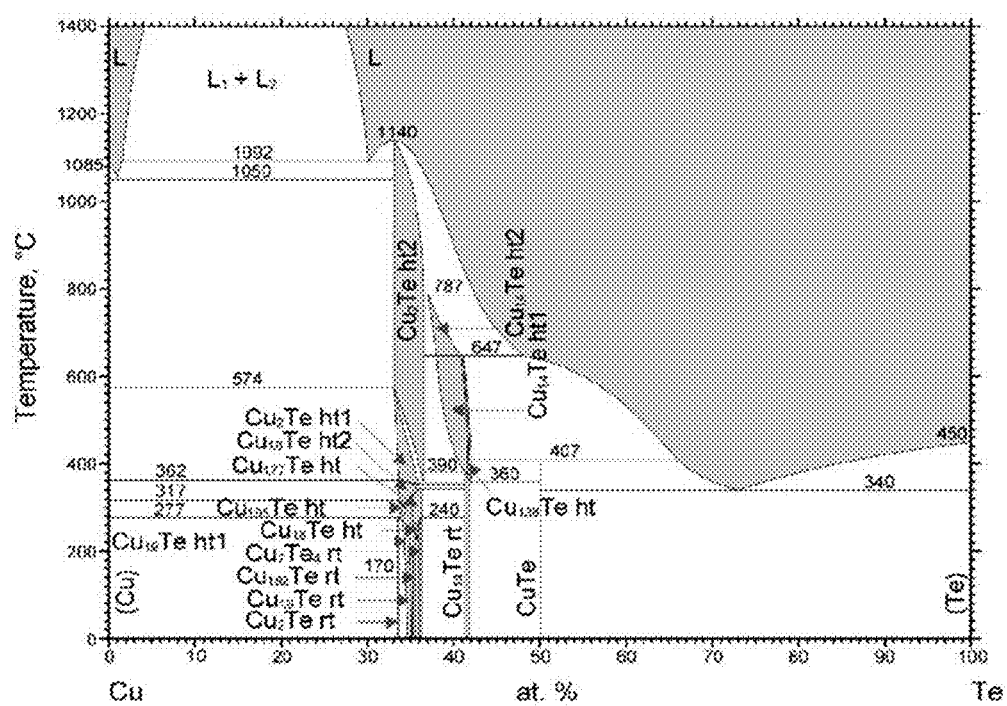
FIG. 3 shows an equilibrium Cu—Te phase diagram.

Similarly, in the equilibrium phase diagram shown in FIG. 2, phases of primary interest include S ((S) 8 α rt in the diagram), CuS (CuS rt in the diagram), and $Cu_{1.8}S$ ($Cu_{1.8}S$ dig ht in the diagram). In particular embodiments, in a $Cu_{1-y}Se_y$ (e.g., where y is greater than or equal to approximately 0.5) alloy sputter target, the amount of $Cu_{1.8}S$ (high melting phase) and S phases should be minimized while the amount of CuS phase should be maximized.

Similarly, in the equilibrium phase diagram shown in FIG. 3, phases of primary interest include Te, CuTe, $Cu_{1.4}Te$ (in the diagram $Cu_{1.4}Te$ rt, $Cu_{1.4}Te$ ht, $Cu_{1.4}Te$ ht1, or $Cu_{1.4}Te$ ht2). In particular embodiments, in a $Cu_{1-z}Te_z$ (e.g., where z is greater than or equal to approximately 0.5) alloy sputter target, the amount of $Cu_{1.4}Te$ (high melting phase) and Te phases should be minimized while the amount of CuTe phase should be maximized.

Figure 4:
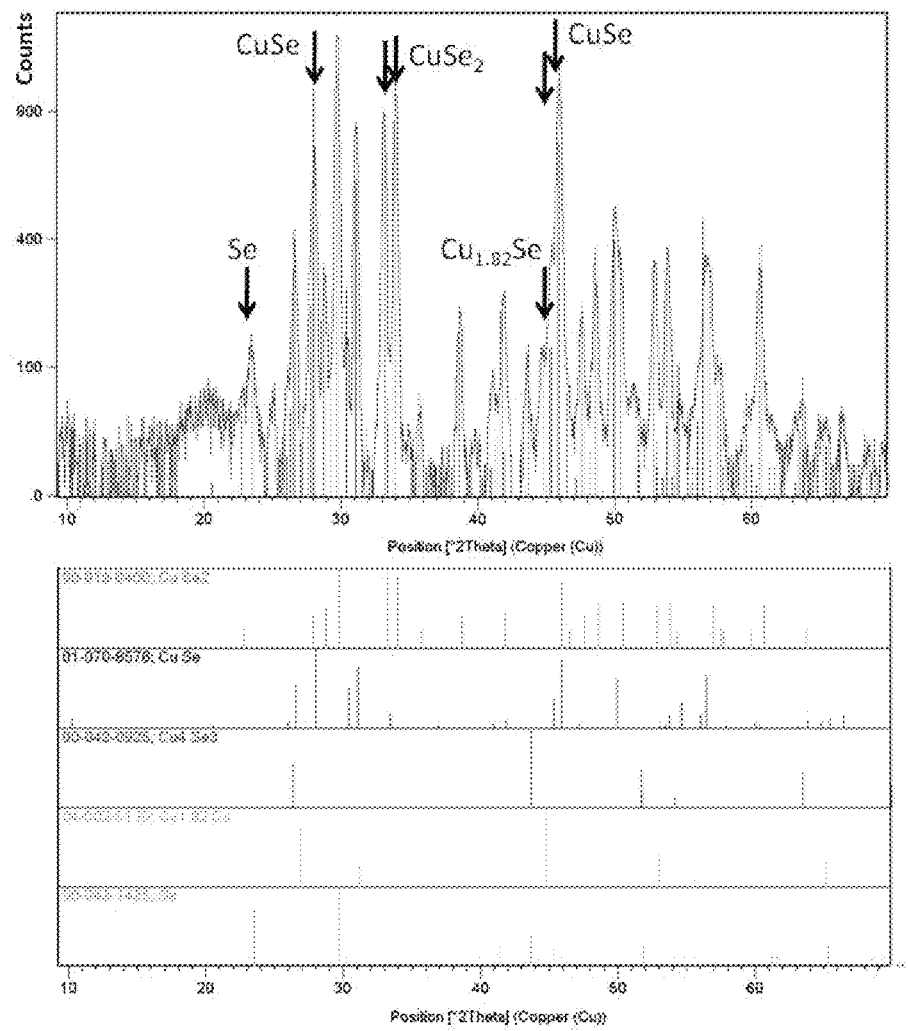
FIG. 4 shows an example characteristic X-ray diffraction pattern obtained with an example sputter target.

Providing manufacturing simplicity while ensuring exact or sufficient stoichiometry control of deposited $Cu_{1-x}(Se_{1-y-z}S_yTe_z)_x$ (e.g., where x is greater than or equal to approximately 0.5, where y is between approximately 0 and 1, and where z is between approximately 0 and 1) can be achieved by non-reactive sputtering of high purity sputter targets of the appropriate materials having the substantially same stoichiometry. The aim of particular embodiments is to fabricate Cu—(Se,S,Te) sputter targets that can be used to deposit films with $Cu_{1-x}(Se_{1-y-z}S_yTe_z)_x$ (e.g., where x is greater than or equal to approximately 0.5, where y is between approximately 0 and 1, and where z is between approximately 0 and 1) composition. Furthermore, the composition of $Cu_{1-x}(Se_{1-y-z}S_yTe_z)_x$ (e.g., where x is greater than or equal to approximately 0.5, where y is between approximately 0 and 1, and where z is between approximately 0 and 1) films deposited by sputtering the sputter target should not change significantly over the lifetime of the target. By way of example, in the case of Cu—Se, this may be achieved in particular embodiments by fabricating a $Cu_{1-x}Se_x$ (where x is greater than or equal to approximately 0.5) sputter target consisting mainly of CuSe and $CuSe_2$ phases. In particular embodiments, it is desirable that at least approximately 50 volume percent (50 vol. %) of such a $Cu_{1-x}Se_x$ sputter target consists of CuSe and $CuSe_2$ phases. In particular embodiments, it is even more desirable that over 80 vol. % of such a $Cu_{1-x}Se_x$ sputter target consists of CuSe and $CuSe_2$ phases. In particular embodiments, it is even further desirable that over 90 vol. % of such a $Cu_{1-x}Se_x$ sputter target consists of CuSe and $CuSe_2$ phases. An example characteristic X-ray diffraction pattern obtained with an example $CuSe_2$ sputter target fabricated according to a particular embodiment is shown in FIG. 4. As evidenced by the X-ray diffraction pattern, it is evident that the $CuSe_2$ sputter target consists of over 50 vol. % of CuSe and $CuSe_2$ phases.

As appreciated by those of skill in the art, during a sputtering process, the sputter target is heated as a result of being bombarded with positive ions. Thus, in example applications, to minimize the formation of Se and $Cu_2Se$ phases, the sputter target should be cooled below approximately 332 degrees Celsius during the sputtering process, and even more desirably, below 200 degrees Celsius. The presence of elemental Se in $Cu_{1-x}Se_x$ (e.g., where x is greater than or equal to approximately 0.5) alloy sputter targets will increase Se evaporation and, therefore, affect the composition of the Cu—Se films sputtered using the target over the lifetime of the target. Moreover, it is expected that $Cu_2Se$ and Se phases have different sputter yield, which may further affect the composition of films sputtered using the target over the lifetime of the target.

In general, in particular embodiments, the total vol. % of elemental Se, S, or Te phases should be less than 50 vol. % of the sputter target composition. By way of example, in a sputter target fabricated to have a $Cu_{1-x}(Se_{1-y-z}S_yTe_z)_x$ (e.g., where x is greater than or equal to approximately 0.5, where y is between approximately 0 and 1, and where z is between approximately 0 and 1) composition, the total vol. % of elemental Se, S, or Te phases should be less than 50 vol. % of the sputter target composition. In a more particular embodiment, such a $Cu_{1-x}(Se_{1-y-z}S_yTe_z)_x$ sputter target should have a composition in which the $Cu_{2-x}Se$, $Cu_{2-x}S$, and $Cu_{2-x}Te$ phases (where x is less than or equal to 0.30) comprise less than 50 vol. % of the total sputter target composition. In a more particular embodiment, such a $Cu_{1-x}(Se_{1-y-z}S_yTe_z)_x$ sputter target in which z is zero (i.e., $Cu_{1-x}(Se_{1-y}S_y)_x$) should have a composition in which the $CuSe_2$, CuSe, and CuS phases comprise at least 50 vol. % of the total sputter target composition. In a more particular embodiment, such a $Cu_{1-x}(Se_{1-y-z}S_yTe_z)_x$ sputter target in which y and z are zero (i.e., $Cu_{1-x}Se_x$) should have a composition in which the $CuSe_2$ and CuSe phases comprise at least 50 vol. % of the total sputter target composition. In a more particular embodiment, such a $Cu_{1-x}(Se_{1-y-z}S_yTe_z)_x$ sputter target in which y and z are zero (i.e., $Cu_{1-x}Se_x$) should have a composition in which the $CuSe_2$ and CuSe phases comprise at least 80 vol. % of the total sputter target composition. In a more particular embodiment, such a $Cu_{1-x}(Se_{1-y-z}S_yTe_z)_x$ sputter target in which y is equal to 1 and z is zero (i.e., $Cu_{1-x}S_x$) should have a composition in which the CuS phase comprises at least 50 vol. % of the total sputter target composition. In a more particular embodiment, such a $Cu_{1-x}(Se_{1-y-z}S_yTe_z)_x$ sputter target in which y is equal to 0 and z is equal to 1 (i.e., $Cu_{1-x}Te_x$) should have a composition in which the CuTe phase comprises at least 50 vol. % of the total sputter target composition. Additionally, in particular embodiments, the $Cu_{1-x}(Se_{1-y-z}S_yTe_z)_x$ (e.g., where x is greater than or equal to approximately 0.5, where y is between approximately 0 and 1, and where z is between approximately 0 and 1) sputter target has a purity of at least approximately 2N7, gaseous impurities less than approximately 500 parts-per-million (ppm) for oxygen (O), nitrogen (N), and hydrogen (H) individually, a carbon (C) impurity less than approximately 500 ppm, and a density of at least 95% of the theoretical density for the sputter target composition. In particular embodiments, such a sputter target may be formed by way of an ingot metallurgical process or a powder metallurgical process.

Additionally, in some embodiments, $Cu_{1-x}(Se_{1-y-z}S_yTe_z)_x$ (e.g., where x is greater than or equal to approximately 0.5, where y is between approximately 0 and 1, and where z is between approximately 0 and 1) sputter targets may be fabricated such that they are doped with elements such as phosphorus (P), nitrogen (N), boron (B), arsenic (As), and antimony (Sb). Furthermore, as it has been determined that the addition of sodium (Na) can improve the electrical or other properties of CIGS absorbers, such a $Cu_{1-x}(Se_{1-y-z}S_yTe_z)_x$ sputter target may be fabricated to contain up to approximately 5 atomic % of at least one element of Na, potassium (K), rubidium (RB), or magnesium (Mg). Additionally, to stabilize the desired phases and minimize Se, S, and Te evaporation during the sputtering process, the $Cu_{1-x}(Se_{1-y-z}S_yTe_z)_x$ sputter targets may be fabricated to contain up to approximately 10 atomic % of at least one element of Al, Si, Ti, V, Zn, Ga, Zr, Nb, Mo, Ru, Pd, In, Sn, Ta, W, Re, Ir, Pt, Au, Pb, and Bi. In some particular embodiments, the $Cu_{1-x}(Se_{1-y-z}S_yTe_z)_x$ sputter targets may be fabricated to contain insulating oxides, nitrides, carbides, and/or borides, among others, to, for example, deposit film structures as described in PCT/US2007/082405 (Pub. No. WO/2008/052067) filed 24 Oct. 2007 and entitled "SEMICONDUCTOR GRAIN AND OXIDE LAYER FOR PHOTOVOLTAIC CELLS," which is hereby incorporated by reference herein. In these such embodiments, the deposited film microstructure becomes granular with the oxides, nitrides, carbides, and/or borides, etc. making the grain boundary phase.

Figure 5:
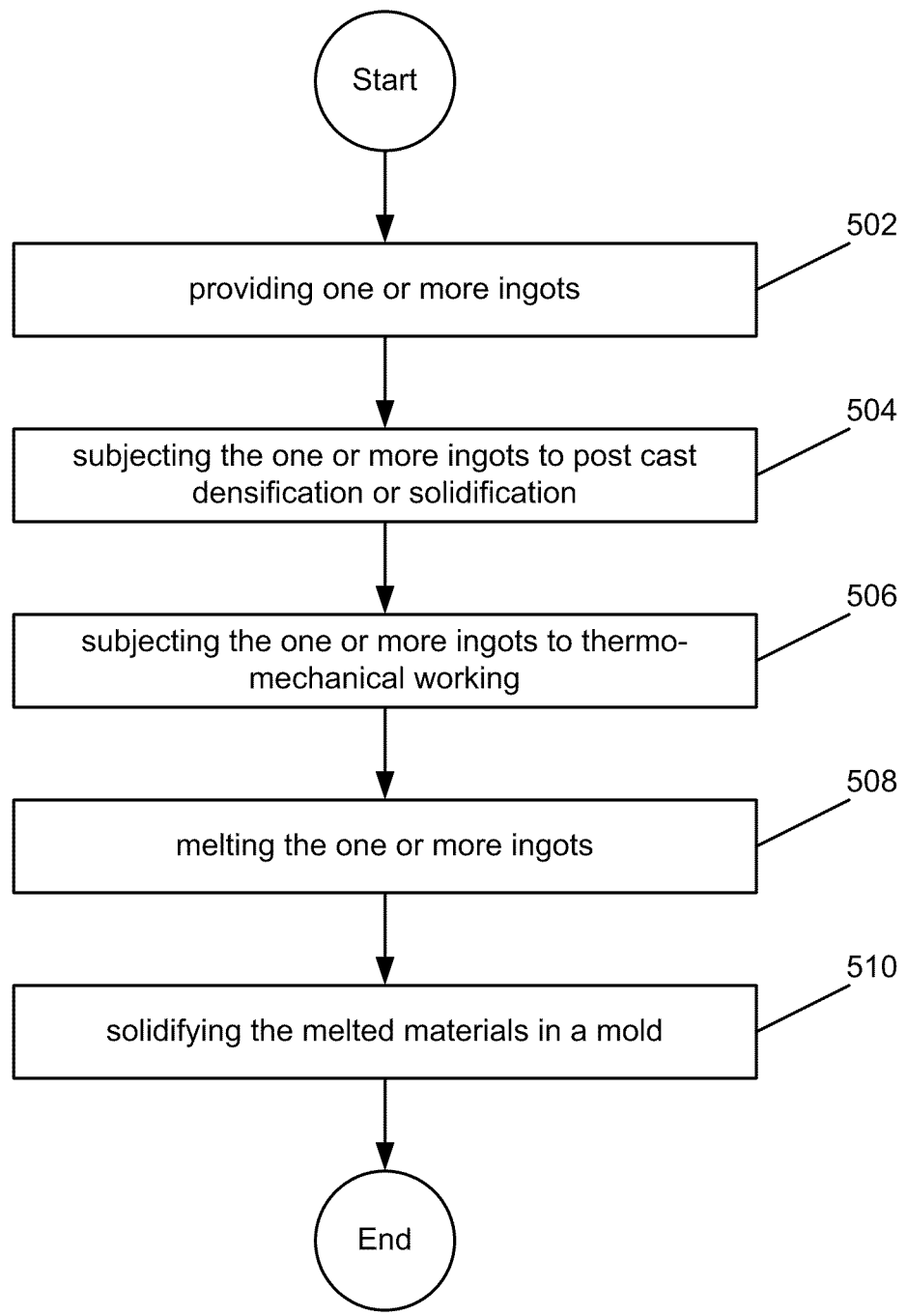
FIG. 5 shows a flowchart illustrating an example process for manufacturing an example sputter target.
Figure 6:
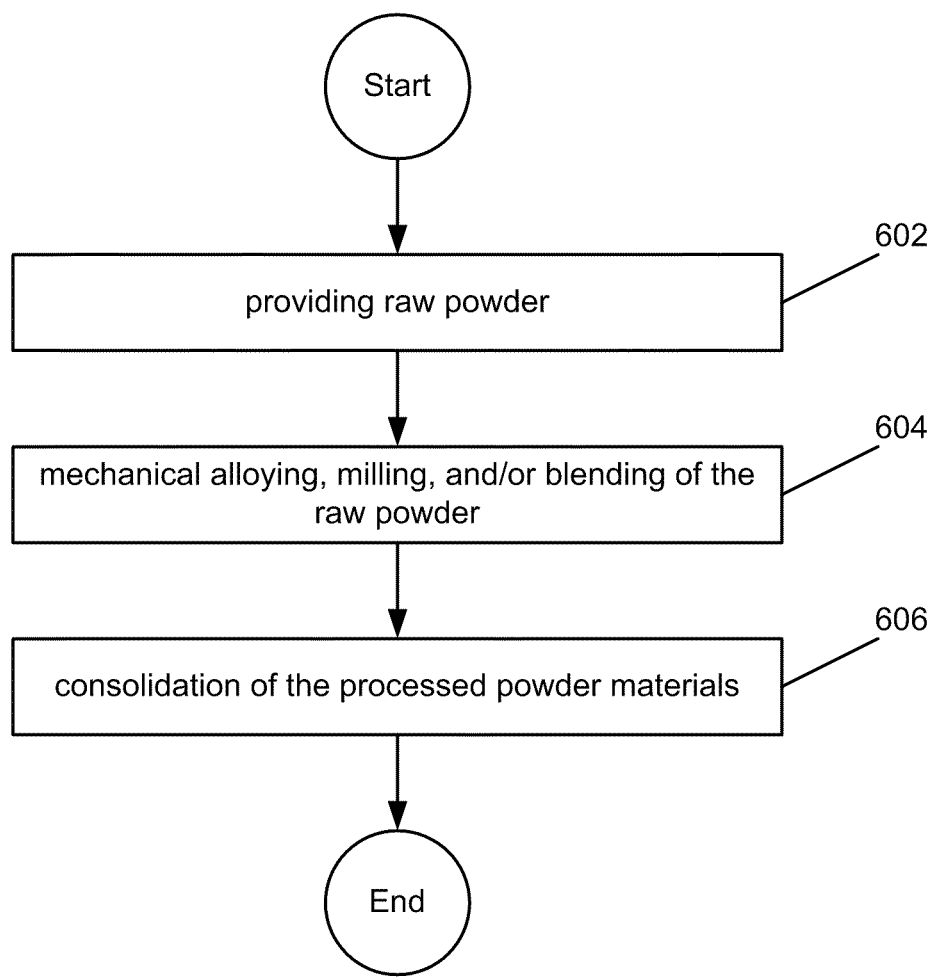
FIG. 6 shows a flowchart illustrating an example process for manufacturing an example sputter target.

Two example processes for manufacturing sputter targets, such as the afore-described sputter targets, will now be described with initial reference to FIGS. 5 and 6. Similar processes are described in U.S. patent application Ser. No. 12/606,709 filed 27 Oct. 2009 and entitled "CHALCOGENIDE ALLOY SPUTTER TARGETS FOR PHOTOVOLTAIC APPLICATIONS AND METHOD OF MANUFACTURING THE SAME," which is hereby incorporated by reference herein. Based on the purity, density, microstructure and compositional requirements of a particular application, the sputter targets may be manufactured using: (1) ingot metallurgy, as described and illustrated, by way of example and not by way of limitation, with reference to the flowchart of FIG. 5; or (2) powder metallurgy, as described and illustrated, by way of example and not by way of limitation, with reference to the flowchart of FIG. 6. It should be noted that the processes described with reference to FIGS. 5 and 6 may each actually include one or more separate processes although the processes described with reference to FIGS. 5 and 6 are each described and illustrated in conjunction with a single flowchart.

In particular embodiments, ingot metallurgy may be used for fabricating sputter targets having alloy compositions containing single or mixed chalcogenides as described above with or without the additives just described, and with a purity of at least approximately 2N7 or greater (e.g., the chalcogenide alloy(s) of the sputter target are at least 99.7% pure) for overall impurity content in the form of traces, gaseous impurities less than approximately 500 parts-per-million (ppm) for oxygen (O), nitrogen (N), and hydrogen (H) individually, and a carbon (C) impurity less than approximately 500 ppm, and a density of at least 95% of the theoretical density for the sputter target composition.

In particular embodiments, the process illustrated with reference to FIG. 5 begins with providing one or more ingots at 502 that collectively contain the material(s) (e.g., elemental or master alloys) of which the resultant sputter target(s) are to be comprised (e.g., one or more ingots that each contain the materials for producing a sputter target having a desired chalcogenide alloy composition, or alternately, two or more ingots that collectively, but not individually, contain the materials for producing the sputter target having the desired chalcogenide alloy composition).

As the chalcogenides are line compounds, they are typically brittle; however, any gas or shrinkage porosities can be prevented using solidification of the ingot(s) at a very controlled rate (e.g., a cooling rate less than approximately 4000 degrees Celsius per minute). In particular embodiments, the density of as-cast ingots can be enhanced through post casting densification of the ingots using, by way of example, hot isostatic pressing and/or other consolidation methods using ambient or elevated temperatures and pressures. Based on the ductility and workability of the alloy, such ingots can be also be subjected in some particular embodiments to thermo-mechanical working to further enhance the density and refine the as-cast microstructure. Examples of thermo-mechanical working include, by way of example and not by way of limitation, uni or multi-directional cold, warm or hot rolling, forging, or any other deformation processing at temperatures ranging from, by way of example, ambient to approximately 50 degrees Celsius below the solidus temperature. Additionally, to facilitate composition control and minimize Se, S, and Te evaporation, any heat treatment of the ingot(s) used to fabricate the sputter targets may be performed in a positive pressure atmosphere of one or more of Se, S, and Te (e.g., greater than approximately 0.01 milliTorr) during melting and/or solidification.

In one example embodiment, the afore-described sputter targets may be manufactured using as-cast ingots as provided at 502. However, in some particular embodiments, as described above, the as-cast ingots may be subjected to post cast densification or solidification at 504. By way of example, post cast densification of the as-cast ingots at 504 may be achieved by hot isostatic pressing at ambient or elevated temperatures and pressures. In still other embodiments, the as-cast ingots may be subjected to post cast densification at 504 followed by thermo-mechanical working at 506. Examples of thermo-mechanical working include, by way of example and not by way of limitation, uni- or multi-directional cold, warm or hot rolling, forging, or any other deformations processing at temperatures ranging, by way of example, from ambient to approximately 50 degrees Celsius lower than the solidus temperature.

In particular example embodiments, the ingots are then melted at 508 using, by way of example, vacuum or inert gas melting (e.g., induction, e-beam melting) at temperatures of, by way of example, up to approximately 200 degrees Celsius above the liquidus in vacuum (at less than approximately 1 Torr). In alternate embodiments, the ingots may be melted in open melters. In either case, the process may then proceed with controlled solidification at 510 (e.g., conventional or assisted by stirring or agitation) in a mold with a cooling rate of, by way of example, less than approximately 4000 degrees Celsius per minute and, in particular embodiments, greater than approximately 1000 degrees Celsius per minute. This allows sufficient time to remove impurities in the form of low density slags. By way of example, fast cooling of $Cu_{1-x}Se_x$ (where x is greater than or equal to 0.50) alloy suppresses the formation of $Cu_2Se$ and Se phases. Exact stoichiometry control can be ensured even for alloys containing low melting high vapor pressure elements (like Ga), by maintaining a positive inert gas pressure (e.g., greater than 0.01 milliTorr), or a positive pressure of at least one of Se, Te, and S, during melting at 508 and/or solidification at 510. The resultant sputter target bodies may then be machined among other conventional processing.

In particular example embodiments, such processes may be used to fabricate chalcogenide alloy sputter targets with microstructures showing mostly equiaxed (>60% by volume) grains (with grain aspect ratios less than 3.5). In most alloys, the columnarity (aspect ratio) in the target microstructure from an as-cast ingot may be removed during machining. In some embodiments, the above microstructural features can also be obtained using stirring or agitating the melt during the solidification process, breaking any columnarity in the microstructure by shear forces. Additionally, it should also be appreciated that ingot metallurgy derived targets can be recycled as remelts. This reduces their cost of ownership quite significantly.

In a specific example embodiment of aN ingot metallurgical process, a $CuSe_2$ sputter target is manufactured using ingot melt stocks (elemental or remelt stocks) under an Se positive pressure (or overpressure) at 725 degrees Celsius (e.g., above 200 degrees Celsius over the liquidus), followed by controlled solidification (e.g., at a cooling rate less than approximately 4000 degrees Celsius per minute). The as-cast ingot may be cross-rolled (e.g., at 30 degree Celsius intervals), in an overpressure of Se, while the temperature at the surface of the ingot is in the range of approximately 100-250 degrees Celsius, and in a particular embodiment, at least 50 degrees Celsius below the solidus temperature. Spent targets of this alloy composition can also be used as remelt stocks.

A second process for forming sputter targets using powder metallurgy will now be described with reference to the flowchart of FIG. 6. In an example embodiment, powder metallurgy may be utilized to fabricate sputter targets having alloy compositions of $Cu_{1-x}(Se_{1-y-z}S_yTe_z)_x$ (e.g., where x is greater than or equal to approximately 0.5, where y is between approximately 0 and 1, and where z is between approximately 0 and 1) with or without doping elements or other additives. In particular embodiments, the resulting sputter targets have a purity of at least approximately 2N7 or greater (e.g., the chalcogenide alloy(s) of the sputter target are at least 99.7% pure) for overall impurity content in the form of traces, gaseous impurities less than approximately 1000 ppm for oxygen (O), nitrogen (N), and hydrogen (H) individually, and a carbon (C) impurity less than approximately 1500 ppm, and a density of at least 95% of the theoretical density for the sputter target composition.

In particular embodiments utilizing powder metallurgy, the sputter targets are manufactured using raw powder(s) provided at 602 followed by mechanical alloying and/or milling (high or low energy) and/or blending of the raw powder (elemental or gas atomized master alloys) at 604, which is then followed by consolidation at 606 in, by way of example, a mold at high pressures and/or temperatures. In particular example embodiments, utilizing judicial selection of raw materials and/or consolidation methods, sputter targets may be formed with chalcogenide alloy densities greater than or equal to approximately 95% of the theoretical density of the alloy. By way of example and not by limitation, example techniques for consolidation at 604 may include one or more of: vacuum hot pressing, hot isostatic pressing, conventional (thermal) sintering (liquid or solid state) or energy-assisted (electric) sintering processes. An example of energy assisted sintering is spark plasma sintering. In one example embodiment, alloy compositions containing low melting elements (e.g., a melting point less than 300 degrees Celsius) such as Se, S, or Te, or other suitable element, are consolidated at 604 using liquid phase sintering processes. A suitable sintering temperature may, for example, be in the range of approximately $0.2\,T_m$ to $0.8\,T_m$, where $T_m$ is the melting temperature of the alloy (typically estimated by DTA analysis) or $0.2\,T_s$ to $0.8\,T_s$, where $T_s$ is the sublimation temperature of any of the chemical components in the alloy.

In particular embodiments, sputter targets made using powder metallurgy as described with reference to FIG. 6 show an average feature size of the largest microstructural feature less than 1000 microns. Furthermore, the microstructure can be designed accordingly by suitable selection of the starting raw powder(s), the respective particle sizes and their distribution and specific surface areas. In a particular embodiment, the ratio of the particle sizes of any two component powders is in the range of approximately 0.01 to 10.

Particular embodiments utilize the mechanical alloying of elemental powders of different atomic specie. Alternate embodiments may utilize rapidly solidified (gas atomized) or melt-crushed master Cu—(Se,S,Te) alloys of the exact or similar nominal composition of the chalcogenide in the desired thin film. Furthermore, in some embodiments, Cu powder is annealed in the presence of at least one of $H_2S$ and $H_2Se$ and/or in a positive pressure atmosphere of at least one of Se, S, and Te. Still other embodiments may utilize a judicial selection of one or multiple master alloys in combination with another single metal or another master alloy. In particular example embodiments, the master alloys can be designed to enhance the electrical conductivity of the resultant sputter target. This may be specifically useful for Ga, In, or other low melting point metal containing alloys, where the low melting metal may be pre-alloyed and may be processed over a much wider process window.

In an example embodiment, Cu—(Se,S,Te) alloys are manufactured using melting (e.g., induction, e-beam melting) of raw melt stocks (e.g., elemental or master alloys) at temperatures up to approximately 200 degrees Celsius above the liquidus in a positive inert gas pressure (e.g, greater than 0.01 milliTorr) or in an overpressure of Se and/or S, followed by fast solidification (or quenching) in a mold with a cooling rate greater than approximately 100 degrees Celsius per minute, and preferably, greater than approximately 1000 degrees Celsius per minute. By way of example, fast cooling of $Cu_{1-x}Se_x$ (where x is greater than or equal to approximately 0.50) serves to suppress the formation of $Cu_2Se$ and Se phases. By way of example, in an example gas atomization process, molten alloy is dispersed into micron-sized powder with gas jets. Thus, this represents a particularly effective method for fabricating Cu—(Se,S,Te) powders with relatively fast cooling rates.

Figure 7A:
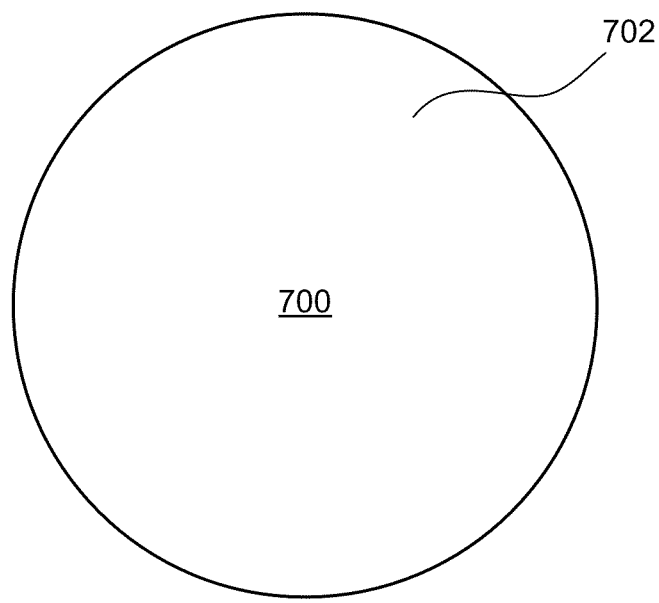
FIGS. 7A and 7B illustrate diagrammatic top and cross-sectional side views, respectively, of an example sputter target.
Figure 7B:
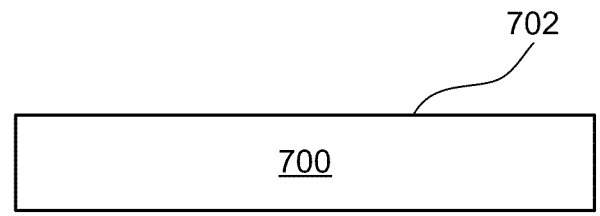

The target body of the resultant sputter targets manufactured according to the described embodiments may, by way of example and not by way of limitation, be a single body of the nominal composition, such as that illustrated in FIGS. 7A and 7B, or a bonded assembly where the target body of the intended nominal composition is bonded to a backing plate using bonding processes employing, by way of example, any or all of adhesive (polymeric or non-polymeric), diffusion bonding, solder bonding or other suitable material joining processes. The target body or target bonded assembly may be disk-shaped, circular, or elliptical in cross section in some particular embodiments. FIGS. 7A and 7B illustrate diagrammatic top and cross-sectional side views, respectively, of an example sputter target 700 having a top sputtering surface 702. In alternate embodiments, the target body or target bonded assembly may take the form of a cylindrical solid with a circular OD (outer diameter) and/or a circular ID (inner diameter), which may also be used as a rotatable assembly in the PVD tool. In still other embodiments, the sputter target may take the form of a rectangular or square piece in which the target body of the intended nominal composition can be a monolithic body or an assembly of several monoliths or tiles. In some embodiments, the target body may be used to deposit sputter films on substrates over an area of, by way of example, approximately 2025 square mm and greater. Although target sizes may vary widely and would generally be dependent on applications such as, by way of example, typical PV applications, in some embodiments the target bodies would be large enough to deposit films uniformly over cells with areas of approximately 156 sq mm and larger and modules in the range of 1.2 square meters.

The present disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend.

What is claimed is:

1. A sputter target structure for depositing semiconducting chalcogenide films, comprising:
   a target body having a target body composition that comprises $Cu_{1-x}(Se_{1-y-z}S_yTe_z)_x$, wherein:
   the value of x is greater than or equal to approximately 0.5;
   the value of y is greater than 0 and less than or equal to 1;
   the value of z is greater than 0 and less than or equal to 1; and
   the total amount of Se, S, and Te phases in the target body composition comprise less than 50 volume percent of the target body composition, and
   wherein at least approximately 50 volume percent (50 vol. %) of the target body composition consists of CuSe and $CuSe_2$ phases.

2. The sputter target structure of claim 1 wherein at least approximately 80 volume percent (80 vol. %) of the target body composition consists of CuSe and $CuSe_2$ phases.

3. The sputter target structure of claim 1 wherein at least approximately 90 volume percent (90 vol. %) of the target body composition consists of CuSe and $CuSe_2$ phases.

4. The sputter target structure of claim 1,
   wherein the sputter target composition has a purity of at least approximately 2N7, gaseous impurities less than approximately 500 parts-per-million (ppm) for oxygen (O), nitrogen (N), and hydrogen (H) individually, a carbon (C) impurity less than approximately 500 ppm, and a density of at least 95% of a theoretical density for the sputter target composition.

5. The sputter target structure of claim 4 wherein the sputter target composition includes one or more dopants selected from the group consisting of phosphorus (P), nitrogen (N), boron (B), arsenic (As), and antimony (Sb).

6. The sputter target structure of claim 4 wherein the sputter target composition contains up to approximately 5 atomic % of at least one element of Na, potassium (K), rubidium (RB), or magnesium (Mg).

7. The sputter target structure of claim 4 wherein the sputter target composition contains up to approximately 10 atomic % of at least one element of Al, Si, Ti, V, Zn, Ga, Zr, Nb, Mo, Ru, Pd, In, Sn, Ta, W, Re, Ir, Pt, Au, Pb, and Bi.

8. The sputter target structure of claim 4 wherein the sputter target composition contains one or more of insulating oxides, nitrides, carbides, and/or borides.

9. The sputter target structure of claim 1 wherein the sputter target composition includes one or more dopants selected from the group consisting of phosphorus (P), nitrogen (N), boron (B), arsenic (As), and antimony (Sb).

10. The sputter target structure of claim 1 wherein the sputter target composition contains up to approximately 5 atomic % of at least one element of Na, potassium (K), rubidium (RB), or magnesium (Mg).

11. The sputter target structure of claim 1 wherein the sputter target composition contains up to approximately 10 atomic % of at least one element of Al, Si, Ti, V, Zn, Ga, Zr, Nb, Mo, Ru, Pd, In, Sn, Ta, W, Re, Ir, Pt, Au, Pb, and Bi.

12. The sputter target structure of claim 1 wherein the sputter target composition contains one or more of insulating oxides, nitrides, carbides, and/or borides.

* * * * *